United States Patent [19]
Credle, Jr. et al.

[11] Patent Number: 5,924,191
[45] Date of Patent: Jul. 20, 1999

[54] PROCESS FOR PRODUCING A CERAMIC-METAL SUBSTRATE

[75] Inventors: Kenneth L. Credle, Jr., Dallas, Tex.; Jürgen Schulz-Harder, Lauf, Germany

[73] Assignee: Curamik Electronics GmbH, Germany

[21] Appl. No.: 08/837,976

[22] Filed: Apr. 14, 1997

[30] Foreign Application Priority Data

Apr. 13, 1996 [DE] Germany .......................... 196 14 501

[51] Int. Cl.$^6$ ............................................... H05K 3/30
[52] U.S. Cl. ............................ 29/832; 29/827; 29/830; 269/614; 428/209
[58] Field of Search .......................... 29/827, 825, 830, 29/832, 740, 840; 428/209; 264/614

[56] References Cited

U.S. PATENT DOCUMENTS 3,778,887 12/1973 Suzuki et al. .

FOREIGN PATENT DOCUMENTS

| 4318463 | 7/1995 | Germany . |
| 5198722 | 8/1993 | Japan . |
| 654143 | 1/1986 | Switzerland . |

*Primary Examiner*—Carl J. Arbes
*Attorney, Agent, or Firm*—Hoffman, Wasson & Gitler

[57] ABSTRACT

A method of producing a ceramic-metal substrate, in which a cooper foil is superficially attached on at least one surface side of a ceramic layer a first metal layer formed by a metal foil, preferably a copper foil. The ceramic layer is then slit after applying the first metal layer, by removing the material of the ceramic layer down to first metal layer. At least one slit at a time is then made in the ceramic layer along at least two edges of the ceramic layer and at a distance from these edges, and extends over the entire length of the edge so that on either side of each slit there is a first ceramic layer section which has the respective adjacent edge and another ceramic layer section. The width of the slit is at least equal to twice the thickness of the ceramic layer. The metal layer is bent 180° in the area of the slits such that the first metal layer forms at least two U-shaped contacts with legs which form on the top of the substrate top contact surfaces which are attached to the other ceramic layer section, and form on the bottom of the substrate bottom contact surfaces. The top and bottom contact surfaces are parallel to one another and are joined to one another on the substrate edge, and in the produced substrate the top and bottom contact surfaces are spaced apart from one another at least by two ceramic layers which are formed by the respective outer first ceramic layer section and the other ceramic layer section.

12 Claims, 5 Drawing Sheets

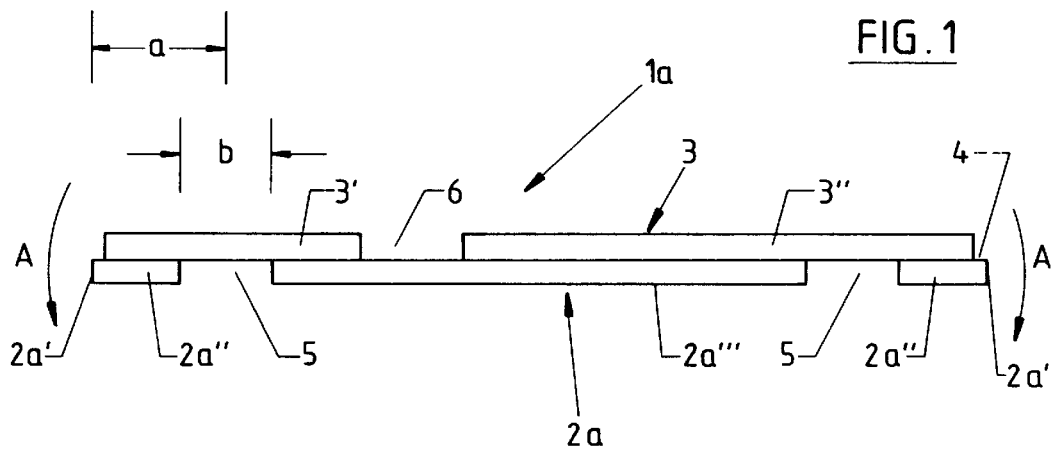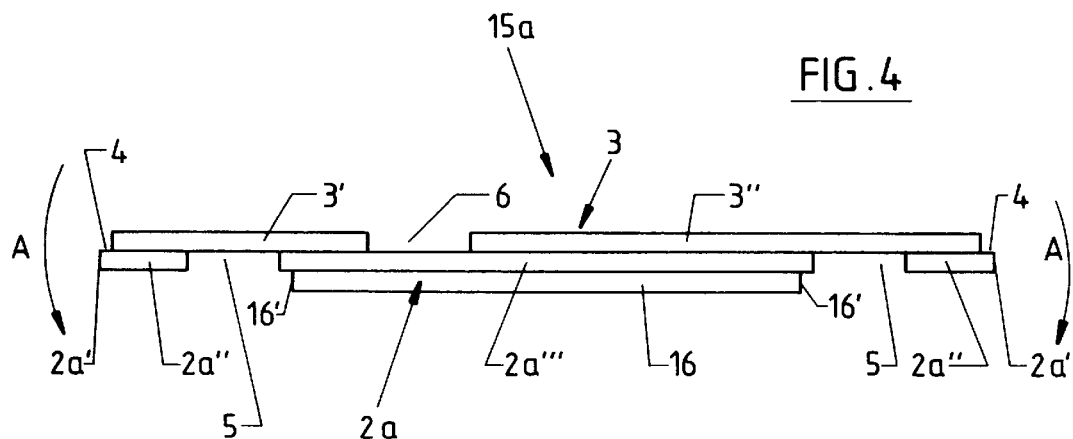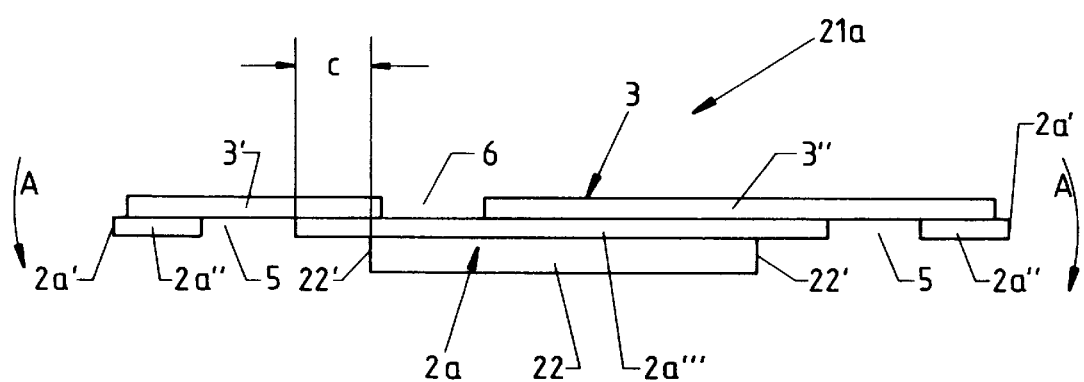

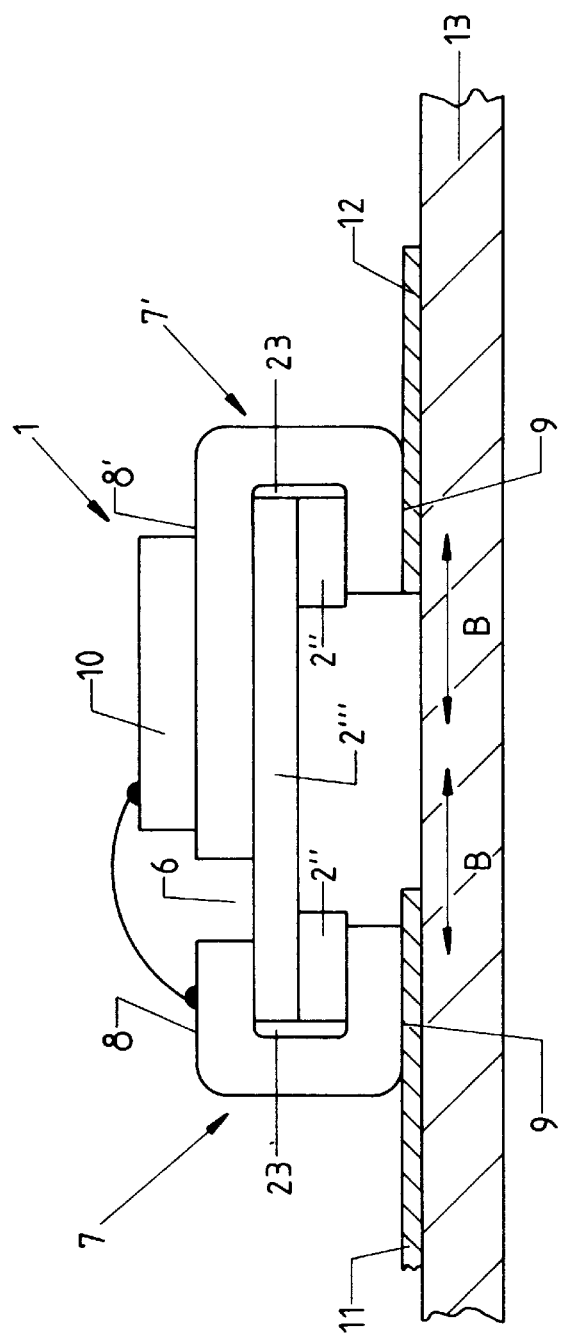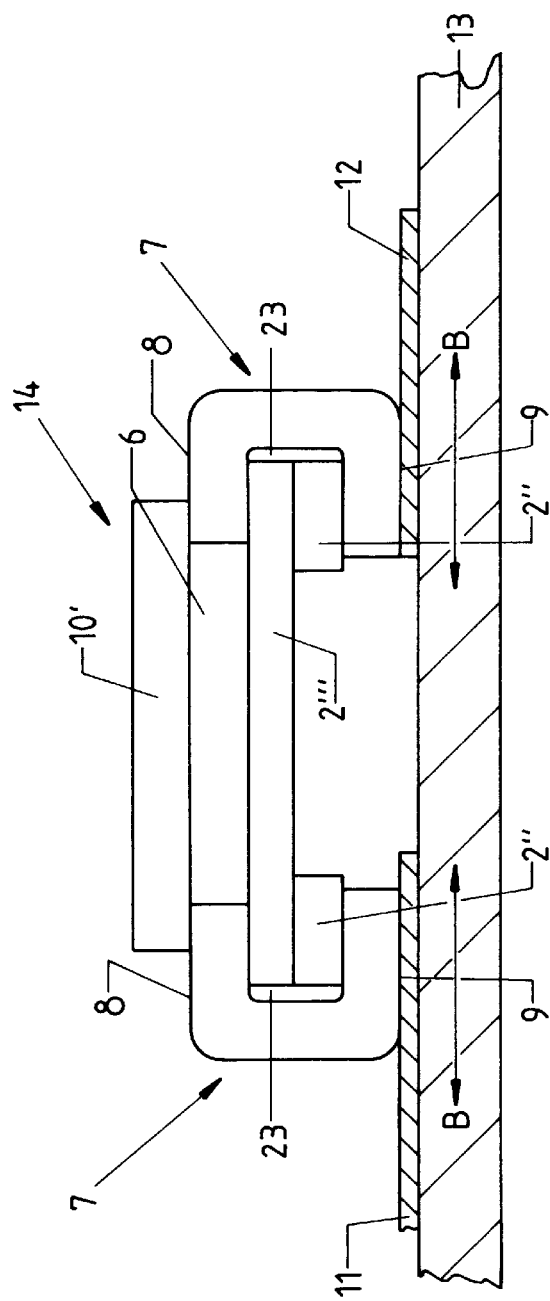

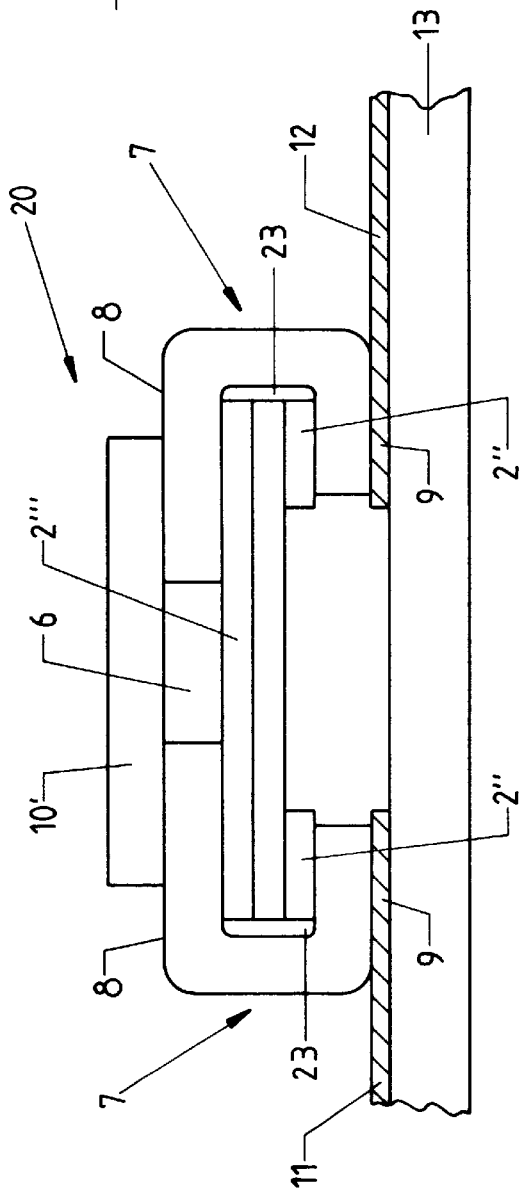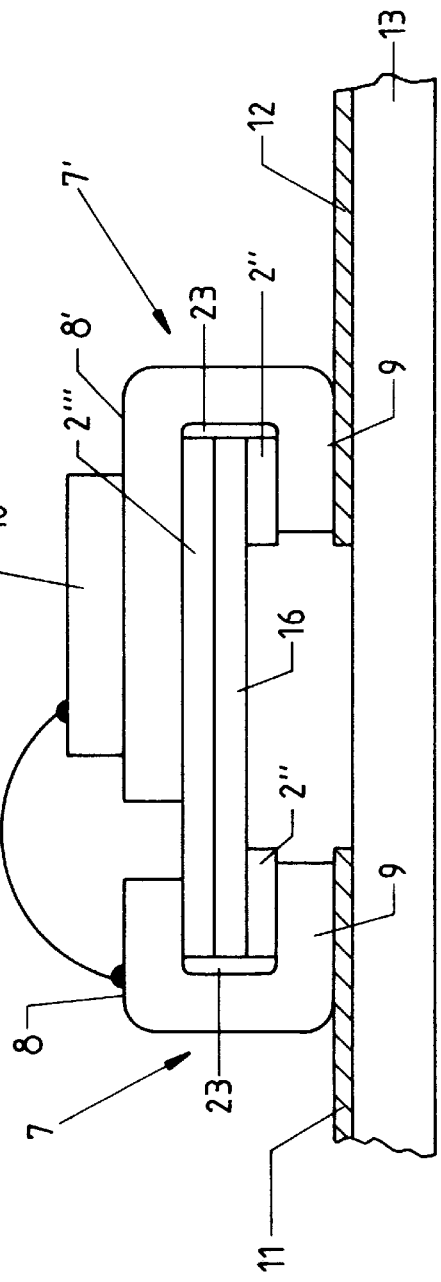

PROCESS FOR PRODUCING A CERAMIC-METAL SUBSTRATE

BACKGROUND OF THE INVENTION

The invention relates to a process a for producing a ceramic-metal substrate.

Processes for producing metal-ceramic substrates and especially for producing copper-ceramic substrates are known in various versions, as are substrates produced using these processes.

Production of a metal coating required to produce printed conductors, terminals, etc. on a ceramic, for example, on an aluminum oxide ceramic using the so-called "DCB process" (direct copper bond technology) using metal or copper foils or metal or copper sheets which form the metal coating, and which have on their surface sides a layer or coating (fused layer) of a chemical compound of the metal and a reactive gas, preferably oxygen, is known. In this process described for example in U.S. Pat. No. 3,744,120 or in German Patent 2,319,854 this layer or this coating (fused layer) forms a eutectic with a melting point below the melting point of the metal (for example, copper) so that by placing the foil on the ceramic and by heating all the layers they can be joined to one another, by fusing the metal or copper essentially only in the area of the fused layer or oxide layer. This DCB process for example has the following process steps:

oxidation of a copper foil such that a uniform copper oxide layer results;

application of the copper foil to the ceramic layer;

heating of the combination to a process temperature between roughly 1070 and 1075° C., for example to roughly 1071° C.; and cooling to room temperature.

SUMMARY OF THE INVENTION

The object of the invention is to devise a process with which a novel metal-ceramic substrate with new advantageous properties can be produced especially easily.

To achieve this object a process for producing a ceramic-metal substrate is provided in which a first metal layer is formed on at least one surface side of a ceramic layer. the first metal layer is formed by a metal foil which is superficially attached. The ceramic layer is slit after applying the first metal layer, by removing the material of the ceramic layer down to the first metal layer. At least one slit at a time is made in the ceramic layer along at least two edges of the ceramic layer, and at a distance from the edges, and extends over the entire length of the edges so that a first ceramic layer section, having a respective adjacent edge, and another ceramic layer section are formed. The width of the slit is equal to at least twice the thickness of the ceramic layer. The first metal layer is bent 180° in the area of the slits so that the first metal layer forms at least two U-shaped contacts with legs which form on the top of the substrate top contact surfaces, which are attached to the other ceramic layer section, and form on the bottom of the substrate contact surfaces. The top and bottom contact surfaces are parallel and joined on the substrate edge. The top and bottom contact surfaces are spaced apart by at least two ceramic layers, which are formed by the outer first ceramic layer section and the other ceramic layer section.

A ceramic metal substrate having at least one first metal layer is formed from a metal foil, preferably a copper foil, and is attached flat to one surface side of a plate-like ceramic layer. The first metal layer forms a top contact surface, in which the first metal layer is routed around at least two edges of the first ceramic layer to form at least tow U-shaped contacts, having legs which form on the top of the substrate, top contact surfaces and form bottom contact surfaces on the bottom of the substrate. The U-shaped contacts are joined flat, on their surface side having the first metal layer, to the plate-like layer of ceramic material. The bottom contact surfaces can move realtime to the second layer which carries the top contact surfaces, with deformation of the section of the U-shaped contacts which form to and bottom contact surfaces.

The substrate according to the invention is characterized in that on its top it has at least two contact surfaces which are provided securely on the second ceramic layer section formed by slitting the initial ceramic layer or on the first ceramic layer formed by this section and to which an electrical component or module can be electrically connected. Furthermore, on the bottom the substrate forms at least two bottom contact surfaces, of which one at a time is joined to the top contact surface on the edge of the substrate. The bottom contact surfaces can move relative to the remainder of the substrate and can be joined to contacts or printed conductors of a circuit board. Thermally-induced various changes of length are balanced by the movable bottom contact surfaces, i.e., different thermal coefficients of expansion between the conventional circuit board material, and the components thus do not lead to mechanical stresses in the components or to destruction of these components, or to mechanical stresses in the printed conductors of the circuit board and/or in the electrical connection between the printed conductors and the substrate or the bottom contact surfaces there, or consequently to possible interruption of the electrical connections.

The substrate according to the invention is especially well suited as an auxiliary or intermediate substrate for use in ceramic components or in components with a housing or component substrate of ceramic.

DETAILED DESCRIPTION OF THE DRAWINGS

The invention is detailed below using the figures in which:

FIGS. 1 and 2 show a substrate blank and the substrate produced from this blank together with an electrical component which has two connections and which is provided on the top of the substrate, and a circuit board, FIG. 3 shows, in a representation like FIG. 2, an altered embodiment of the substrate of FIG. 2;

FIGS. 4 and 5 show in representations like FIG. 1 and 2, a substrate blank and the substrate produced from this blank by bending according to another embodiment of the invention;

FIG. 7 shows in a representation like FIG. 5, an altered embodiment of the substrate of FIG. 5; and FIGS. 8 and 9, show in a representation like FIG. 1 and 2, a substrate blank and the substrate produced from this blank in another embodiment of the invention.

DETAILED DESCRIPTION OF THE PREFERRED EMBODIMENTS

Figure 6:
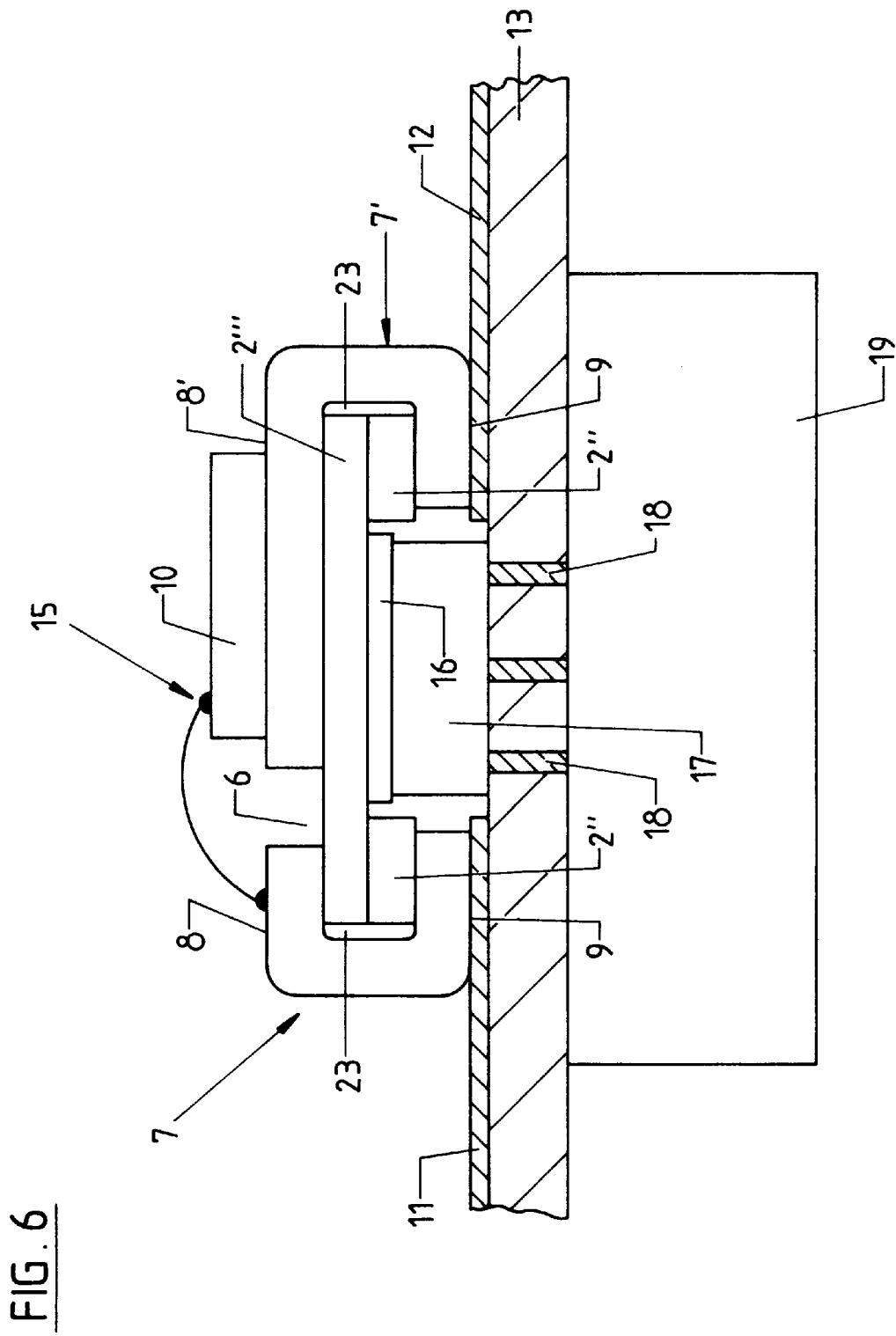
FIG. 6 shows a circuit with the substrate from FIG. 5.

FIGS. 1 and 2 show substrate blank 1a (FIG. 1) and metal-ceramic substrate 1 produced from this blank (FIG. 2).

Substrate blank 1a consists of a plate or initial layer 2a of ceramic, for example, aluminum oxide ceramic. Layer 2a for example has a rectangular or quadratic pattern in which two sides 2a' are perpendicular to the plane of the drawing in FIG. 1 and two sides are parallel to the plane of the drawing of FIG. 1. Layer 2a is provided on one surface side with a metal coating or metal layer, i.e., in the embodiment shown with copper layer 3 which is formed by a copper foil and covers the top of ceramic layer 2a except for narrow edge area 4 which extends around the entire periphery of ceramic layer 2a. The foil which forms copper layer 3 is joined superficially to the top of ceramic layer 2a using the DCB technique (direct copper bonding) known to one skilled in the art. After producing this combination of ceramic layer 2a and copper layer 3, ceramic layer 2a is slit along two sides 2a' which run perpendicularly to the plane of the drawing of FIG. 1 over the entire width, i.e., over the entire length of these sides 2a', or provided with two slits 5 which are open towards the bottom of substrate blank 1a and on the two ends and in which the ceramic material has been completely removed so that on the bottom of each slit 5 the material of copper layer 3 is exposed. Slits 5 which each have a rectangular cross section in the embodiment shown are produced for example by mechanical means by mechanical removal of ceramic layer 2a in the area of slits 5. Each slit 5 in the transverse direction and parallel to the plane of ceramic layer 2a has slit width b which is greater than twice the thickness d of ceramic layer 2a. Furthermore each slit 5 has distance a from adjacent side 2a'.

By means of the two slits 5, ceramic layer 2a forms a total of three sections, i.e., two outside, strip-shaped sections 2a" and middle section 2a'". All sections are joined to one another by copper layer 3 which overlaps slits 5. Copper layer 3 is textured at least in its part provided on section 2a'" even before making slits 5, for example using conventional masking and etching techniques. This is possible since it is a flat combination.

Copper layer 3 is textured for substrate blank 1a such that in the area of section 2a'" it has an interruption 6 in which the top of ceramic layer 2a is exposed. Copper layer 3 thus forms two sections which lie on either side of interruption 6, specifically smaller section 3' which is the left one in FIG. 1 and larger section 3" which is the right one in this FIG. Interruption 6 for this reason is nearer slit 5 which is the left one in FIG. 1 than slit 5 which is the right one in this Figure, the two edges of interruption 6 which run parallel to sides 2a' however are spaced away from the inside edge of adjacent slit 5 so that copper layer 3 overlaps slits 5.

Basically it is possible to texture copper layer 3 also after slitting of ceramic layer 2a, but then when using conventional masking and etching techniques the bottom of each slit 5 must be provided with masking which prevents the copper material located there from etching off.

To produce substrate 1 from substrate blank 1a, copper layer 3 in the area of two slits 5 is bent by 180° (arrows A of FIG. 1) such that the side of section 2a" facing away from copper layer 3 lies against the side of section 2a'" likewise facing away from copper layer 3 and thus substrate 1 shown in FIG. 2 is obtained in which sections 2a" and 2a'" form ceramic layers 2" and 2'" respectively.

After bending copper layer 3, section 3' forms U-shaped contact 7 with top flat contact surface 8 and bottom flat contact surface 9 and section 3" forms a U-shaped contact 7' with top flat contact surface 8' and bottom flat contact surface 9'. The contact surfaces of each contact 7 or 7' are parallel to the plane of ceramic layer 2a and are electrically connected to one another. Top contact surface 8' is used for surface mounting of power components 10, for example a power diode or power transistor, with its electrode which is used to dissipate thermal power loss (for example, anode or collector). Contact 7' is then used at the same time also as a cooling body via which the thermal power loss is dissipated.

Two bottom contact surfaces 9 are surface mounted on contact surfaces or printed conductors 11 and 12 on the top of circuit board 13. The latter consists of the conventional circuit board material, specifically of fiber-reinforced plastic.

Substrate 1, which is made like a SMD component, has among others the advantage that electrical component 10 is not attached directly to circuit board 13 or to printed conductors 11 and 12 there. Since plastic circuit board 13 has a much greater coefficient of thermal expansion than the material of ceramic layer 2a or section 2a'", and the coefficient of thermal expansion of this ceramic material is equal to or at least roughly equal to the coefficient of thermal expansion of component 10, temperature-induced different changes of length between component 10 and circuit board 13 are balanced via substrate 1, i.e., by movement of bottom contact surfaces 9 relative to layer 2'" as is illustrated in FIG. 2 with double arrows B, and with deformation of contacts 7 and 7'. Destruction or damage of component 10 is thus effectively avoided during extreme temperature fluctuations.

Substrate 14 of FIG. 3 differs from substrate 1 simply in that copper layer 3 was structured such that interruption 6 is formed in the middle between two slots 5 so that after bending of the corresponding substrate blank into substrate 14 two identical contacts 7 are obtained. Between contact surfaces 8 electrical component 10' is attached by surface mounting. This component 10' in the embodiment shown is a ceramic component, for example, a capacitance or a resistance.

Width b of slits 5 in substrates 1 and 14 is selected such that between the two edges of ceramic layer section 2a'" and the adjacent part of contacts 7 or 7' which forms contact surface 8 and 9 and 8' and 9', gap 23 remains so that thermal balancing is possible without the action of force on ceramic layer section 2a'".

FIG. 4 shows substrate blank 15a from which substrate 15 of FIG. 5 is produced by bending. Substrate blank 15a corresponds in its structure to substrate blank 1a, simply with the difference that on the bottom of section 2a'" of ceramic layer 2a another copper foil or layer 16 is applied superficially, in turn using the DCB process. This copper layer 16 with its two edges 16' which run perpendicularly to the plane of the drawing and thus parallel to the sides ends somewhat in front of the adjacent side of respective slit 5 so that on sides 16' ceramic layer 2a lies exposed in an narrow edge area. Substrate blank 15 is produced preferably such that copper layers 3 and 16 are applied first to the two surface sides of ceramic layer 2a. Then these copper layers are treated for example using conventional masking and etching techniques such that they have the texturing shown in FIG. 4. Slits 5 are made as the next process step. In substrate blank 15a width b of slits 5 is greater than twice the thickness d of ceramic layer 2a plus the thickness of copper layer 16.

Substrate 15 is produced from substrate blank 15a by bending of copper layer 3 in the area of slits 5. The substrate then on the bottom of layer 2'" formed by ceramic layer section 2a'" between two contact surfaces 9 has copper layer 16 exposed which then according to FIG. 6 can be thermally joined to metal block 17 provided on the top of circuit board 13, for example, 32 by soldering or via a heat conductive paste. Metal block 17 is part of a heat sink and is thermally joined to cooling body 19 provided on the bottom of circuit board 13 via thermal bridges 18 which pass through circuit board 13. Thermal bridges 18 in the simplest case are pins of material with good thermal conductivity, for example, copper, which are joined to metal block 17 likewise consisting of copper for example, and cooling body 19.

In spite of optimum cooling of power component 10 or 10' and in spite of a compact and small design, mechanical stresses resulting from the varied thermal expansion of the material of circuit board 13 and component 10 are also prevented on this component.

FIG. 7 in a representation like FIG. 5 shows substrate 20 which differs from the substrate of FIG. 15 simply in that copper layer 3 is textured in turn such that two identical sections 3' are formed laterally from interruption 6 and thus two identical contacts 7 are formed. There is component 10' on both ends on top contact surfaces 8.

In substrates 15 and 20 ceramic layer sections 2a" with their surface side facing away from copper layer 3 and contact surfaces 9 lie against the bottom of additional copper layer 16 without being joined to this copper layer so that equalization of different, thermally-induced changes of length movement of contact surfaces 9 or the corresponding deformation of contacts 7 or 7' is possible according to double arrows B.

Figure 9:
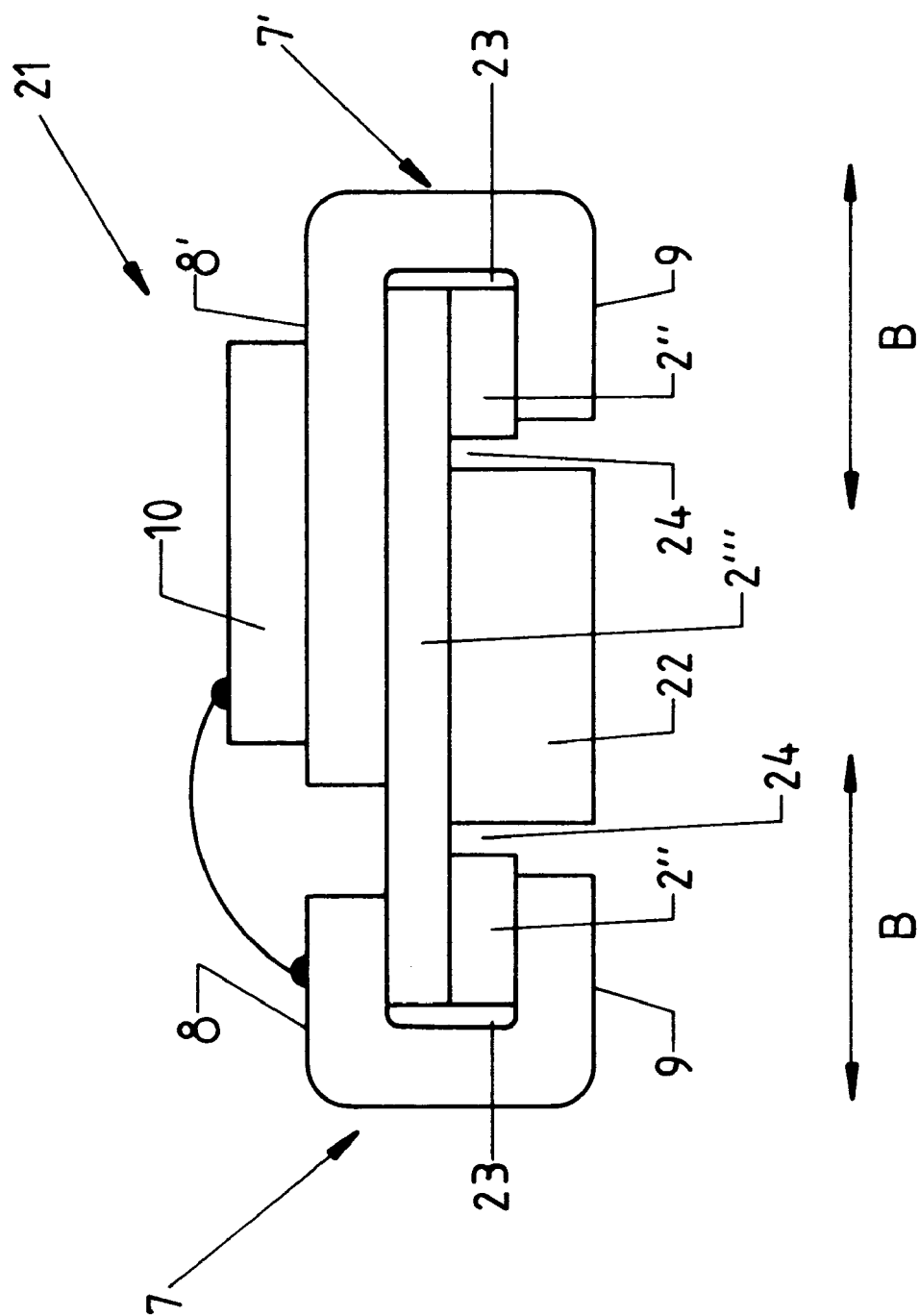

FIG. 8 shows, as another possible embodiment, substrate blank 21a for producing substrate 21 which is shown in FIG. 9. Substrate 21a differs from substrate 15 in that layers 2" lie directly against the bottom of layer 2'" and instead of additional copper layer 16 there is copper layer 22 with a bottom which lies in the plane with contact surfaces 9. To do this, copper layer 22 has a thickness which is equal to the sum of thicknesses of copper layer 3 and ceramic layer 2a. In the embodiment shown the thickness of ceramic layer 2a is identical to thickness d of copper layer 3 so that the thickness of additional copper layer 22 is 2d. Furthermore, copper layer 22 is textured such that with its sides 22' which run perpendicularly to the plane of the drawing of FIG. 8 and thus parallel to slits 15 or sides 2a' it ends at distance c from the inside edge of slit 5 adjacent at the time, which (distance) is greater than the width of outside ceramic layer sections 2a" in the plane of ceramic layer 2a and perpendicular to sides 2a'. Width b of slits 5 in substrate blank 21a is in turn somewhat greater than twice the thickness d of ceramic layer 2a.

In substrate 15 and 20, by corresponding selection of width b of slits 5, the gap 23 is formed between the edges of layer 2'". and additional copper layer 16 and the part of contacts 7 or 7' which joins contact surfaces 8 or 8' and 9. In substrate 21 there is additional gap 24 between respective edge 22' of copper layer 22 and the adjacent edge or adjacent side of ceramic layer section 2a" and the bent part of copper layer 3.

We claim:

1. A process for producing a ceramic-metal substrate, comprising the steps of:

forming a first metal layer from a metal foil and superficially attaching said first metal layer on at least one surface side of a ceramic layer forming at least one slit in said ceramic layer after attaching said first metal layer, by removing material of said ceramic layer down to said first metal layer wherein at least one slit at a time is made in said ceramic layer along at least two edges of said ceramic layer and at distance from said at least two edges and extends over an entire length of said at least two edges so as to form on either side of said at least one slit a first ceramic layer section which has a respective adjacent edge and another ceramic layer section, wherein a width of said at least one slit is at least twice a thickness of said ceramic layer, and bending said metal layer 180° near said at least one slit such that said first metal layer forms at least two U-shaped contacts with legs, which form on a top of a substrate, top contact surfaces which are attached to said other ceramic layer section, and which form, on a bottom of said substrate, bottom contact surfaces said top and bottom contact surfaces being parallel and joined to one another on an edge of said substrate, and wherein said top and bottom contact surfaces are spaced apart by at least two ceramic layers which are formed by said first ceramic layer section and said other ceramic layer section.

2. A process according to claim 1, further comprising the step of texturing said metal layer.

3. A process according to claim 2, further comprising the step of forming at least one interruption in said metal layer.

4. A process according to claim 1, wherein said at least one slit is made in said ceramic layer parallel to said edges of said ceramic layer.

5. A process according to claim 1, wherein a second metal layer is applied to a bottom of said ceramic layer.

6. A process according to claim 1, wherein said first metal layer is bent near said at least one slit such that said first ceramic layer section with a surface side facing away from said first metal layer abuts a surface side of said other ceramic layer section facing away from said first metal layer.

7. A process according to claim 1, wherein a second metal layer is selected such that after said bending step, said first ceramic layer section abuts said second metal layer.

8. A process according to claim 1, wherein a second metal layer is shaped such that after said step of bending said first metal layer near said at least one slit, a surface side of an outside of said first ceramic layer section facing away from said first metal layer rests against a surface side of said other ceramic layer section facing away from said first metal layer.

9. A process according to claim 1, wherein a distance of said at least one slit from a respective edge of said ceramic layer is selected such that between said bottom contact surfaces a surface side of said other ceramic layer section facing away from one of said first metal layer and second metal layer is accessible.

10. A process according to claim 5, wherein said width of said at least one slit is at least twice said thickness of said ceramic layer plus a thickness of said second metal layer.

11. A process according to claim 5, wherein one of said first metal layer, said second metal layer and said first metal layer and said second metal layer are provided by applying metal foil using a direct bonding technique.

12. A process according to claim 1, wherein said ceramic layer is one of an aluminum oxide ceramic and aluminum nitride ceramic.

* * * * *